US011159136B2

(12) United States Patent
Tsai et al.

(10) Patent No.: US 11,159,136 B2
(45) Date of Patent: Oct. 26, 2021

(54) VARIABLE GAIN AMPLIFIER AND METHOD THEREOF

(71) Applicant: Industrial Technology Research Institute, Hsinchu (TW)

(72) Inventors: Jeng-Han Tsai, Taipei (TW); Yi-Tso Cheng, Taipei (TW); Wei-Tsung Li, New Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 61 days.

(21) Appl. No.: 16/730,961

(22) Filed: Dec. 30, 2019

(65) Prior Publication Data

US 2021/0203296 A1 Jul. 1, 2021

(51) Int. Cl.
*H03G 3/30* (2006.01)
*H03F 1/02* (2006.01)
*H03F 3/21* (2006.01)
*H03F 3/19* (2006.01)

(52) U.S. Cl.
CPC .......... *H03G 3/3036* (2013.01); *H03F 1/0205* (2013.01); *H03F 3/19* (2013.01); *H03F 3/21* (2013.01)

(58) Field of Classification Search
CPC .......... H03G 3/30; H03G 3/3036; H03F 1/22; H03F 1/223; H03F 1/226
USPC .................................. 330/133, 254, 278, 311
See application file for complete search history.

(56) References Cited

U.S. PATENT DOCUMENTS

| 6,392,487 | B1 | 5/2002 | Alexanian |
| 7,332,967 | B2 | 2/2008 | Rogers et al. |
| 8,085,091 | B2 | 12/2011 | Adbelli et al. |
| 8,860,508 | B1 * | 10/2014 | Davis .................. H03G 1/0088 330/254 |
| 8,907,724 | B2 | 12/2014 | Rao et al. |
| 2013/0113566 | A1 | 5/2013 | Forejt et al. |

FOREIGN PATENT DOCUMENTS

| TW | 200419951 A | 10/2004 |
| TW | 200541207 | 12/2005 |
| TW | I644512 B | 12/2018 |
| TW | 201926890 A | 7/2019 |

OTHER PUBLICATIONS

Taiwan Patent Office, Office Action, Patent Application Serial No. 109101663, dated May 29, 2020, Taiwan.
Li, Wei-Tsung et al. "60-GHz 5-bit phase shifter with integrated VGA phase-error compensation," IEEE Transactions on Microwave Theory and Techniques, Mar. 2013, pp. 1224-35, vol. 61, No. 3, IEEE, US.

(Continued)

*Primary Examiner* — Steven J Mottola (57) ABSTRACT

A variable gain amplifier (VGA) is provided. The VGA includes at least one amplifier circuit, at least one current-steering circuit and at least one bias voltage circuit. Each current-steering circuit is coupled to its corresponding amplifier circuit. Each bias voltage circuit is coupled to its corresponding current-steering circuit to provide a positive bias voltage to each current-steering circuit.

16 Claims, 4 Drawing Sheets

(56) References Cited

OTHER PUBLICATIONS

Wu, Dake. et al. "A 0.4-V Low Noise Amplifier Using Forward Body Bias Technology for 5 GHz Application," IEEE Microwave & Wireless Components Letters, Jul. 2007, pp. 543-545, vol. 17, No. 17, IEEE, US.

Hsieh, Chia-Yu et al. "A 57-64 GHz low-phase-variation variable-gain amplifier," IEEE MTT-S Int. Microwave Symp. Dig., 2012, pp. 373-376, IEEE, US.

Huang, Dong et al. "A 60 GHz 360° 5-bit Phase Shifter with Constant IL Compensation Followed by a Normal Amplifier with ±1 dB Gain Variation and 0.6 dBm OP-1dB," IEEE Transactions on V.1.1 9044D-A26799-US 3/3 Circuits and Systems—II: Express Briefs, Dec. 2017, pp. 1437-1441, vol. 64, No. 12, IEEE, US.

Hsieh, Yi-Keng et al. "A 60 GHz Broadband Low-Noise Amplifier With Variable-Gain Control in 65 nm CMOS," IEEE Microwave and Wireless Components Letters, Nov. 2011, pp. 610-612, vol. 21, No. 11, IEEE, US.

Siao, Di-Sheng et al., "A 60 GHz Low Phase Variation Variable Gain Amplifier in 65 nm CMOS," IEEE Microwave and Wireless Components Letters, Jul. 2014, pp. 457-459, vol. 24, No. 7, IEEE, US.

Byeon, Chul Woo et al. "A 60 GHz Variable Gain Amplifier with a Low Phase Imbalance in 0.18 μm SiGe BiCMOS Technology," IEEE Compound Semiconductor Integrated Circuit Symposium (CSICS), La Jolla, CA, 2012, pp. 1-4, IEEE, US.

Tsai, Zuo-Min et al. "A compact low DC consumption 24-GHz Cascode HEMT VGA," Asia Pacific Microwave Conference, Singapore, 2009, pp. 1625-1627, IEEE, US.

Yeh, Han-Chih et al. "A Wide Gain Control Range V-Band CMOS Variable-Gain Amplifier With Built-In Linearizer," IEEE Transactions on Microwave Theory and Techniques, Feb. 2013, pp. 902-913, vol. 61, No. 2, IEEE, US.

Ellinger, Frank et al. "Analysis and compensation of phase variations versus gain in amplifiers verified by SiGe HBT cascode RFIC," IEEE Transactions on Microwave Theory and Techniques, Aug. 2009, pp. 1885-1894, vol. 57, No. 8, IEEE, US.

Tsai, Jeng-Han et al., "A V-band Variable Gain Amplifier with Low Phase Variation using 90 nm CMOS Technology," Microwave and Optical Technology Letters, Aug. 2014, pp. 1946-1949, vol. 56, No. 8, Wiley Periodicals, Inc., US.

Min, Byung-Wook et al., "Ka-Band SiGe HBT Low Phase Imbalance Differential 3-Bit Variable Gain LNA," IEEE Microwave and Wireless Components Letters, Apr. 2008, pp. 272-274, vol. 18, No. 4, IEEE, US.

Min, Byung-Wook et al., "Single-Ended and Differential Ka-Band BiCMOS Phased Array Front-Ends," IEEE Journal of Solid-State Circuits, Oct. 2008, pp. 2239-2250, vol. 43, No. 10, IEEE, US.

Palomba, Mirko et al. "Variable Gain Amplifier architecture with constant matching and insertion phase," European Microwave Conference, Nuremberg, 2013, pp. 1503-1506, EuMA, Germany.

\* cited by examiner

VARIABLE GAIN AMPLIFIER AND METHOD THEREOF

TECHNICAL FIELD

The disclosure generally relates to a variable gain amplifier (VGA) technology for increasing the variable-gain range of the VGA in the low-power operation.

BACKGROUND

A variable gain amplifier (VGA) can increase or reduce the power of a transmitted or received radio frequency (RF) signal and then transmit the RF signal to the next stage circuit. The VGA is widely used in different application, e.g. remote-control toys, consumer mobile communication electronic devices, base stations, military applications, and space applications.

Current electronic devices may use a power supply with a lower voltage, in order to save power and extend the life of the battery. However, as the power supply's voltage drops, the variable-gain range of the VGA will become smaller, and as a result, the VGA function will be limited. Therefore, how to maintain the variable-gain range of a VGA without increasing the power supply's voltage when the VGA is operating at low-power is subject worthy of discussion.

BRIEF SUMMARY

A variable gain amplifier (VGA) and a method for increasing the variable-gain range are provided to overcome the problems described above.

An embodiment in accordance with the disclosure provides a variable gain amplifier (VGA). The VGA comprises at least one amplifier circuit, at least one current-steering circuit and at least one bias voltage circuit. Each current-steering circuit is coupled to its corresponding amplifier circuit. Each bias voltage circuit is coupled to its corresponding current-steering circuit to provide a positive bias voltage to each current-steering circuit.

An embodiment in accordance with the disclosure provides a method for increasing variable gain. The method for increasing variable gain is applied to an amplifier (VGA). The method for increasing variable gain comprises the steps of configuring at least one bias voltage circuit in the VGA, wherein each bias voltage circuit is coupled to each current-steering circuit of the VGA; and providing a positive bias voltage to each current-steering circuit through each bias voltage circuit.

Other aspects and features of the disclosure will become apparent to those with ordinary skill in the art upon review of the following descriptions of specific embodiments of the variable gain amplifier and the method for increasing the variable-gain range.

BRIEF DESCRIPTION OF THE DRAWINGS

The disclosure will become more fully understood by referring to the following detailed description with reference to the accompanying drawings, wherein.

DESCRIPTION OF THE EMBODIMENTS

The descriptions of the disclosure are some embodiments for the purpose of illustrating the general principles of the disclosure and should not be configured to limit the disclosure. The scope of the invention is determined by reference to the appended claims.

Figure 1:
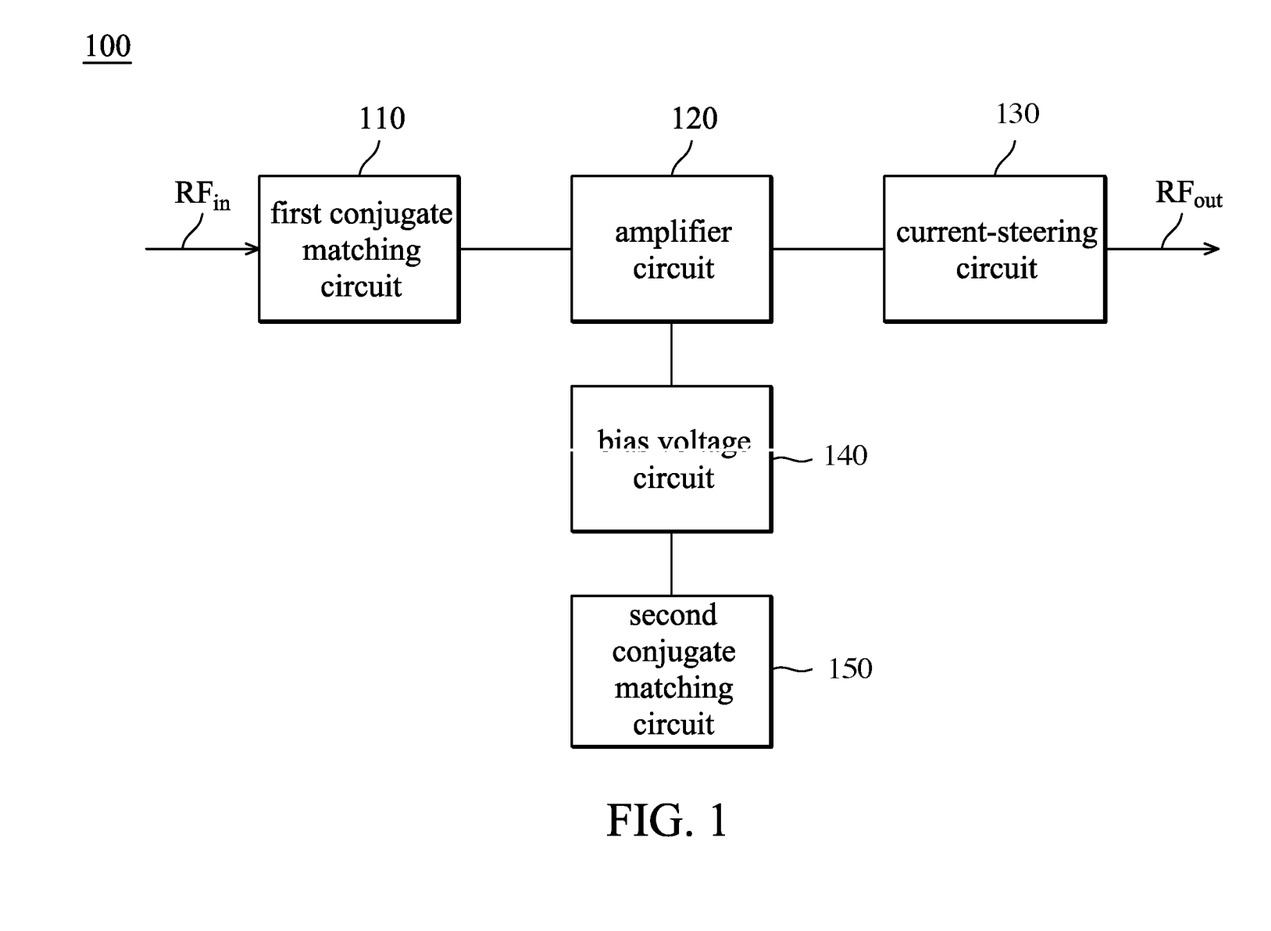
FIG. 1 is a block diagram of a variable gain amplifier (VGA) 100 according to an embodiment of the disclosure.

FIG. 1 is a block diagram of a variable gain amplifier (VGA) 100 according to an embodiment of the disclosure. As shown in FIG. 1, the VGA 100 may comprise a first conjugate matching circuit 110, an amplifier circuit 120, a current-steering circuit 130, a bias voltage circuit 140 and a second conjugate matching circuit 150. It should be noted that FIG. 1 presents a simplified block diagram in which only the elements relevant to the disclosure are shown. However, the disclosure is not limited to what is shown in FIG. 1. The VGA 100 may comprise other conjugate matching circuit, amplifier, current-steering circuit and bias voltage circuit.

In the embodiments of the disclosure, the first conjugate matching circuit 110 is coupled to the amplifier circuit 120. The first conjugate matching circuit 110 may be configured to receive the radio frequency (RF) input signal $RF_{in}$, and perform conjugate matching for the RF input signal $RF_{in}$. After the conjugate matching for the RF input signal $RF_{in}$ is performed, the first conjugate matching circuit 110 may transmit the RF input signal $RF_{in}$ to the amplifier circuit 120.

In the embodiments of the disclosure, the amplifier circuit 120 may be configured to enlarge the RF input signal $RF_{in}$ in which the conjugate matching has been performed. In addition, in the embodiments of the disclosure, the amplifier circuit 120 may be a cascode amplifier circuit, e.g. the first amplifier circuit 220 and the second amplifier circuit 260 shown in FIGS. 2A-2B.

In the embodiments of the disclosure, the current-steering circuit 130 is coupled to the amplifier circuit 120. The current-steering circuit 130 is configured to control the gain generated by amplifier circuit 120. Details will be illustrated by FIGS. 2A-2B below. According to an embodiment of the disclosure, the current-steering circuit 130 may be a digital circuit. Details will be illustrated by FIG. 2A below. According to another embodiment of the disclosure, the current-steering circuit 130 may be an analog circuit. Details will be illustrated by FIG. 2B below.

In the embodiments of the disclosure, the bias voltage circuit 140 is coupled to the current-steering circuit 130. The bias voltage circuit 140 may be configured to provide a positive bias voltage to the current-steering circuit 130 to increase the control voltage range of the current-steering circuit 130 or to increase the steering current of the current-steering circuit 130. Details will be illustrated by FIGS. 2A-2B below.

In the embodiments of the disclosure, the second conjugate matching circuit 150 is coupled to the amplifier circuit 120. The second conjugate matching circuit 150 may be configured to perform conjugate matching for the output signal of the amplifier circuit 120 to output the RF output signal $RF_{out}$. In other embodiments of the disclosure, the second conjugate matching circuit 150 may be coupled to the next stage amplifier circuit, and transmit the output signal of the amplifier circuit 120 in which the conjugate matching has been performed to the next stage amplifier circuit. Details will be illustrated by FIGS. 2A-2B below.

Figure 2A:
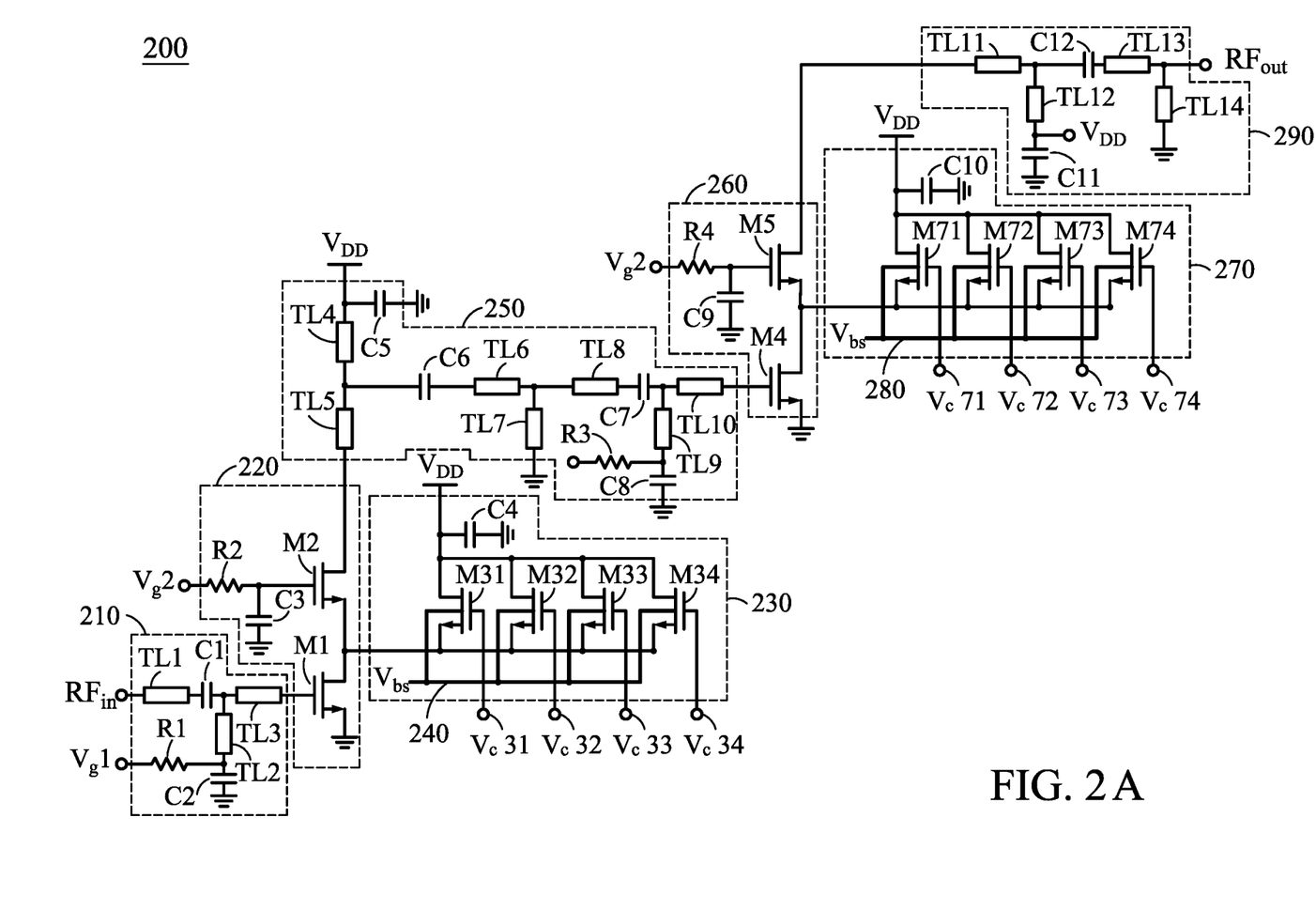
FIG. 2A is a circuit diagram of a VGA 200 according to an embodiment of the disclosure.

FIG. 2A is a circuit diagram of a VGA 200 according to an embodiment of the disclosure. In the embodiment, as shown in FIG. 2A, the VGA 200 may comprise a first conjugate matching circuit 210 (could be corresponded to the first conjugate matching circuit 110), a first amplifier circuit 220 (could be regarded as the amplifier circuit 120), a first current-steering circuit 230 (could be regarded as the current-steering circuit 130), a first bias voltage circuit 240 (could be regarded as the bias voltage circuit 140) and a second conjugate matching circuit 250 (could be regarded as the second conjugate matching circuit 150), a second amplifier 260, a second current-steering circuit 270, a second bias voltage circuit 280 and a third conjugate matching circuit 290. In the embodiment, the first current-steering circuit 230 and the second current-steering circuit 270 are digital circuits. In addition, it should be noted that FIG. 2A shows the VGA 200 which comprises two stages of amplifier circuits, but the disclosure is not limited thereto. The embodiment of FIG. 2A also could be applied to the VGA which comprises one stage of amplifier circuit or the VGA which comprises more than two stages of amplifier circuits. For example, if the VGA 200 only comprise one stage of amplifier circuit, the VGA 200 may only comprise a first conjugate matching circuit 210 (could be corresponded to the first conjugate matching circuit 110), a first amplifier circuit 220 (could be regarded as the amplifier circuit 120), a first current-steering circuit 230 (could be regarded as the current-steering circuit 130), a first bias voltage circuit 240 (could be regarded as the bias voltage circuit 140) and a second conjugate matching circuit 250 (could be regarded as the second conjugate matching circuit 150).

As shown in FIG. 2A, the first conjugate matching circuit 210 may comprise transmission lines TL1~TL3, capacitors C1 and C2 and a resistor R1. One end of the transmission line TL1 may receive the RF input signal $RF_{in}$, and the other end of the transmission line TL1 is coupled to the capacitor C1. One end of the transmission line TL2 is coupled to the capacitor C1 and the transmission line TL3 and the other end of the transmission line TL2 is coupled to the resistor R1 and capacitor C2. One end of the transmission line TL3 is coupled to the capacitor C1 and the transmission line TL2, and the other end of the transmission line TL3 is coupled to the first amplifier circuit 220. One end of resistor R1 is coupled to the transmission line TL2 and the capacitor C2, and the other end of the resistor R1 is coupled to voltage source $V_g1$.

As shown in FIG. 2A, the first amplifier circuit 220 may comprise a first transistor M1, a second transistor M2, a resistor R2 and a capacitor C3. The gate of the first transistor M1 is coupled to the transmission line TL3 of the first conjugate matching circuit 210 to receive the RF input signal $RF_{in}$ in which the conjugate matching has been performed by the first conjugate matching circuit 210. The source of the first transistor M1 is coupled to a ground. The drain of the first transistor M1 is coupled to the source of the second transistor M2. The gate of the second transistor M2 is coupled to the resistor R2 and the capacitor C3 and receives the voltage source $V_g2$ via the resistor R2. The source of the second transistor M2 is coupled to the drain of the first transistor M1 and the first current-steering circuit 230. The drain of the second transistor M2 is coupled to the second conjugate matching circuit 250. One end of the capacitor C3 is coupled to the ground, and the other end of the capacitor C3 is coupled to the gate of the second transistor M2 and the resistor R2. The capacitor C3 may be regarded as a voltage-regulation capacitor to regulate the gate voltage of the second transistor M2. One end of the resistor R2 is coupled to the voltage source $V_g2$, and the other end of the resistor R2 is coupled to the gate of the second transistor M2 and the capacitor C3. The resistor R2 could be regarded as a protection device to avoid large currents which may lead to the second transistor M2 breaking.

As shown in FIG. 2A, the first current-steering circuit 230 may comprise the transistors M31, M32, M33 and M34 and capacitor C4. The transistors M31, M32, M33 and M34 are triple-well transistors and are connected in parallel. The gates of the transistors M31, M32, M33 and M34 may respectively receive the digital control signals $V_c31$, $V_c32$, $V_c33$ and $V_c34$. According to the digital control signals $V_c31$, $V_c32$, $V_c33$ and $V_c34$, the transistors M31, M32, M33 and M34 may steer current from the second transistor M2 to control the gain of the first amplifier circuit 220. The sources of the transistors M31, M32, M33 and M34 are coupled to the drain of the first transistor M1 and the source of the second transistor M2. The drains of the transistors M31, M32, M33 and M34 are coupled to the capacitor C4 and the voltage source $V_{DD}$. The bodies of the transistors M31, M32, M33 and M34 may receive a positive bias voltage $V_{bs}$ from the first bias voltage circuit 240. One end of the capacitor C4 is coupled to the ground, and the other end of the capacitor C4 is coupled to the drains of the transistors M31, M32, M33 and M34 and the voltage source $V_{DD}$. In the embodiments of the disclosure, each bias voltage circuit (e.g. the first bias voltage circuit 240 and the second bias voltage circuit 280) may be coupled to the bodies of the triple-well transistors of its corresponding current-steering circuit (e.g. the first current-steering circuit 230 and the second current-steering circuit 270).

Details of the operations of the first current-steering circuit 230 will be further illustrated below. In the embodiment, the digital control signals $V_c31$, $V_c32$, $V_c33$ and $V_c34$ (0 or 1) is used to enable or disable the transistors M31, M32, M33 and M34. When one or more of the transistors M31, M32, M33 and M34 are enabled, the current flowing to the second transistor M2 will be drawn to the transistors M31, M32, M33 and M34, as a result, the current of the second transistor M2 will decrease. When the current of the second transistor M2 decreases, the transduction value (gm2) will decrease. Therefore, in the embodiment, the digital control signals $V_c31$, $V_c32$, $V_c33$ and $V_c34$ could be used to adjust the current flowing to the second transistor M2 to achieve the purpose of controlling the whole gain value of the first amplifier circuit 220. For example, when more transistors M31, M32, M33 and M34 are enabled, the current flowing to the second transistor M2 will be drawn more, as a result, the whole gain value of the first amplifier circuit 220 will decrease more, and vice versa.

As shown in FIG. 2A, the first bias voltage circuit 240 may comprise a plurality of conducting wires. These conducting wires are coupled to the bodies of the transistors M31, M32, M33 and M34 to provide the positive bias voltage $V_{bs}$ to the bodies of the transistors M31, M32, M33 and M34 through the conducting wires. Because the transistors M31, M32, M33 and M34 are triple-well transistors, the body of each transistor M31, M32, M33 and M34 could be connected to a wire to receive the voltage (i.e. the positive bias voltage $V_{bs}$ provided by the first bias voltage circuit 240). In addition, referring to the equation, $V_{th}=V_{th0}+\gamma(\sqrt{2\varphi_f-V_{bs}}-\sqrt{2\varphi_f})$, we know that when the positive bias voltage $V_{bs}$ is not 0 and is positive, the threshold voltage $V_{th}$ will become smaller. Therefore, in the embodiment, when the bodies of the transistors M31, M32, M33 and M34 receive the positive bias voltage $V_{bs}$, the threshold voltages $V_{th}$ of the transistors M31, M32, M33 and M34 will decrease. When the threshold voltages $V_{th}$ of the transistors M31, M32, M33 and M34 decreases, the transistors M31, M32, M33 and M34 could draw more current from the second transistor M2, and therefore, the adjustable variable-gain range will increase.

As shown in FIG. 2A, the second conjugate matching circuit 250 may comprise transmission lines TL4~TL10, capacitors C1~C8 and a resistor R3. One end of the transmission line TL4 is coupled to the voltage source VDD and capacitor C5, and the other end of the transmission line TL4 is coupled to the transmission line TL5 and capacitor C6. One end of the transmission line TL5 is coupled to the transmission line TL4 and capacitor C6, and the other end of the transmission line of the drain of the second transistor M2. One end of the transmission line TL6 is coupled to the capacitor C6, and the other end of the transmission line LT6 is coupled to the transmission line TL7 and transmission line TL8. One end of the transmission line TL7 is coupled to the transmission line TL6 and the ground, and the other end of the transmission line TL7 is coupled to the transmission line TL8. One end of the transmission line TL8 is coupled to the transmission line TL6 and the transmission line TL7, and the other end of the transmission line TL8 is coupled to the capacitor C7. One end of the transmission line TL9 is coupled to the capacitor C7 and transmission line TL10, and the other end of the transmission line TL9 is coupled to the capacitor C8 and resistor R3. One end of the transmission line TL10 is coupled to the transmission line TL9 and capacitor C7, and the other end of the transmission line TL10 is coupled to the second amplifier circuit 260. One end of the resistor R3 is coupled to the voltage source Vg1, and the other end of the resistor R3 is coupled to the transmission line TL9 and capacitor C8. One end of the capacitor C8 is coupled to the resistor R3 and transmission line TL9, and the other end of the capacitor C8 is coupled to the ground.

As shown in FIG. 2A, the second amplifier circuit 260 may comprise a fourth transistor N4, a fifth transistor M5, a resistor R4 and a capacitor C9. The gate of the fourth transistor N4 is coupled to the transmission line TL10 of the second conjugate matching circuit 250 to receive the output signal of the second conjugate matching circuit 250. The source of the fourth transistor N4 is coupled to the ground. The drain of the fourth transistor N4 is coupled to the source of the fifth transistor N5. The gate of the fifth transistor N5 is coupled to the resistor R4 and capacitor C9 and receive voltage source $V_g2$. The source of the fifth transistor N5 is coupled to the drain of the fourth transistor N4 and the second current-steering circuit 270. The drain of the fifth transistor N5 is coupled to the third conjugate matching circuit 290. One end of the capacitor C9 is coupled to the ground, and the other end of the capacitor C9 is coupled to the gate of the fifth transistor N5 and the resistor R4. The capacitor C9 may be regarded as a voltage-regulation capacitor to regulate the gate voltage of the fifth transistor M5. One end of the resistor R4 is coupled to the voltage source $V_g2$, and the other end of the resistor R4 is coupled to the gate of the fifth transistor M5 and the capacitor C9. The resistor R4 could be regarded as a protection device to avoid large currents which may lead to the fifth transistor M5 breaking.

As shown in FIG. 2A, the second current-steering circuit 270 may comprise the transistors M71, M72, M73 and M74 and capacitor C10. The transistors M71, M72, M73 and M74 are triple-well transistors and are connected in parallel. The gates of the transistors M71, M72, M73 and M74 may respectively receive the digital control signals $V_c71$, $V_c72$, $V_c73$ and $V_c74$. According to the digital control signals $V_c71$, $V_c72$, $V_c73$ and $V_c74$, the transistors M71, M72, M73 and M74 may steer current from the fifth transistor M5 to control the gain of the second amplifier circuit 260. The sources of the transistors M71, M72, M73 and M74 are coupled to the drain of the fourth transistor M4 and the source of the fifth transistor M5. The drains of the transistors M71, M72, M73 and M74 are coupled to the capacitor C10 and the voltage source $V_{DD}$. The bodies of the transistors M71, M72, M73 and M74 may receive a positive bias voltage $V_{bs}$ from the second bias voltage circuit 280. One end of the capacitor C10 is coupled to the ground, and the other end of the capacitor C10 is coupled to the drains of the transistors M71, M72, M73 and M74 and the voltage source $V_{DD}$. The operation of the second current-steering circuit 270 is similar to the first current-steering circuit 230. Therefore, the details will not be repeated here.

As shown in FIG. 2A, the second bias voltage circuit 280 may comprise a plurality of conducting wires. These conducting wires are coupled to the bodies of the transistors M71, M72, M73 and M74 to provide the positive bias voltage $V_{bs}$ to the bodies of the transistors M71, M72, M73 and M74 through the conducting wires. Because the transistors M71, M72, M73 and M74 are triple-well transistors, a wire could be connected to its body to receive the voltage (i.e. the positive bias voltage $V_{bs}$ provided by the second bias voltage circuit 280). In addition, referring to the equation, $V_{th}=V_{th0}+\gamma(\sqrt{2\varphi_f-V_{bs}}-\sqrt{2\varphi_f})$, we know that when the positive bias voltage $V_{bs}$ is not 0 and is positive, the threshold voltage $V_{th}$ will become smaller. Therefore, in the embodiment, when the bodies of the transistors M71, M72, M73 and M74 receive the positive bias voltage $V_{bs}$, the threshold voltages $V_{th}$ of the transistors M71, M72, M73 and M74 will decrease. When the threshold voltages $V_{th}$ of the transistors M71, M72, M73 and M74 decreases, the transistors M71, M72, M73 and M74 could draw more current from the fifth transistor M5, and therefore, the adjustable variable-gain range will increase.

As shown in FIG. 2A, the third conjugate matching circuit 290 may comprise transmission lines TL11~TL14 and capacitors C11 and C12. One end of the transmission line TL11 is coupled to the drain of the fifth transistor M5, and the other end of the transmission line TL11 is coupled to the transmission line TL12 and the capacitor C12. One end of the transmission line TL12 is coupled to the transmission line TL11 and the capacitor C12, and the other end of the transmission line TL12 is coupled to the capacitor C11 and voltage source $V_{DD}$. One end of the transmission line TL13 is coupled to the capacitor C12 and the other end of the transmission line TL13 is coupled to the transmission line TL14 and outputs the output RF signal $RF_{out}$. One end of the transmission line TL14 is coupled to the transmission line TL13, and the other end of the transmission line TL14 is coupled to ground.

When the voltage source $V_{DD}$ provided to the VGA 200 is decreased, the variable-gain range will decrease. Specifically, when the voltage source $V_{DD}$ provided to the VGA 200 is decreased, the ability of the first current-steering circuit 230 of drawing the current from the second transistor M2 and the ability of the second current-steering circuit 270 of drawing the current from the fifth transistor M5 will decrease. Therefore, the gain range which is adjustable according to the digital control signals $V_c31$, $V_c32$, $V_c33$ and $V_c34$ and the digital control signals $V_c71$, $V_c72$, $V_c73$ and $V_c74$ will decrease (i.e. the variable-gain range of the VGA 200 will decrease). Therefore, in the embodiment, the first bias voltage circuit 240 and the second bias voltage circuit 280 configured in the VGA 200 could avoid the problem of the decrease of the variable-gain range when the VGA is operated in low voltage (i.e. the source voltage $V_{DD}$ becomes smaller).

Specifically, the structures of the first conjugate matching circuit 210, the second conjugate matching circuit 250, and the third conjugate matching circuit 290 shown in FIG. 2A are used to illustrate the embodiments of the invention, but the disclosure should not be limited thereto. In other embodiments of the disclosure, for different requirements, other structure of the conjugate matching circuit also could be adopted. In addition, in other embodiments of the disclosure, the number of the conjugate matching circuits in the VGA 200 also could be adjusted and changed.

Figure 2B:
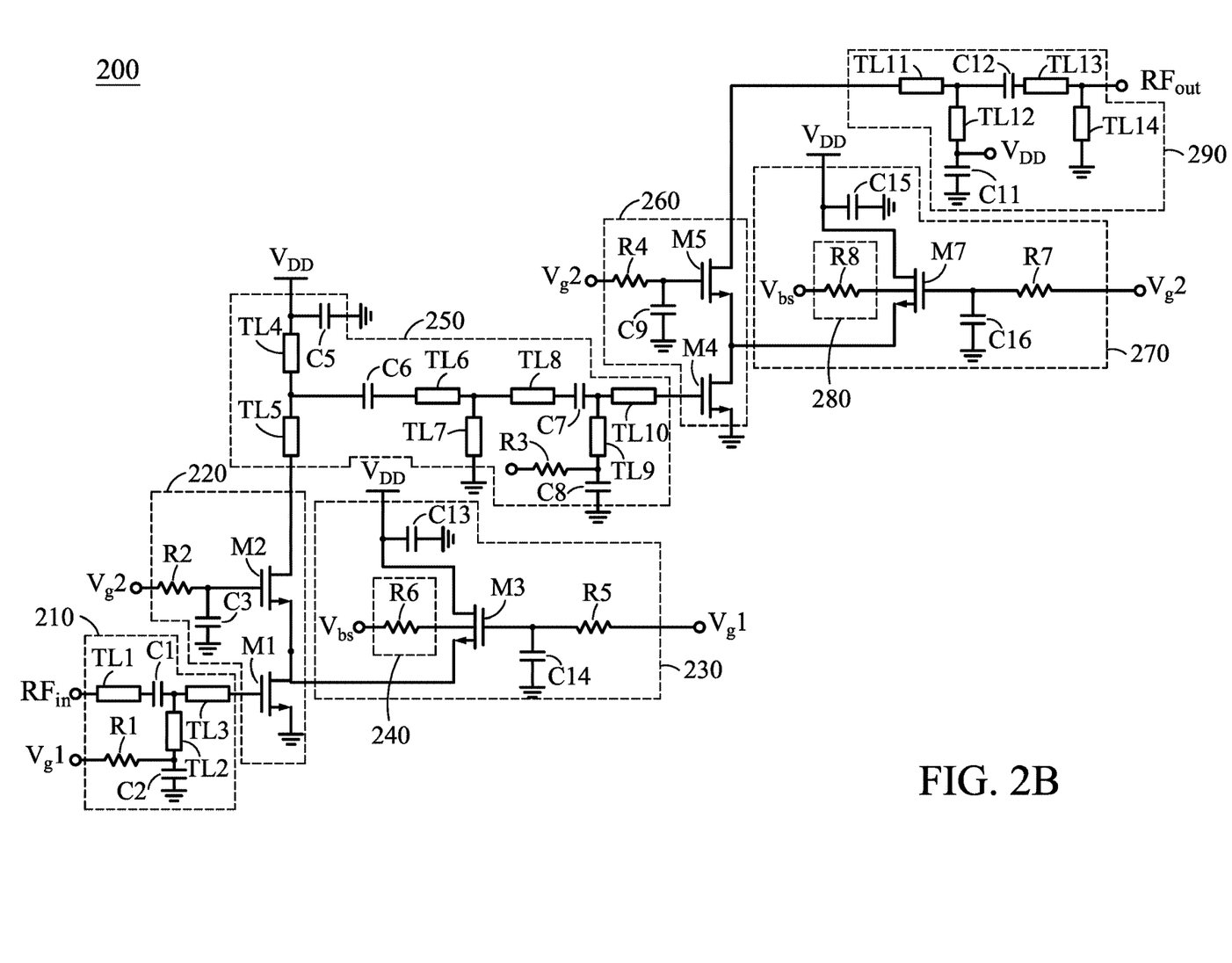
FIG. 2B is a circuit diagram of a VGA 200 according to another embodiment of the disclosure.

FIG. 2B is a circuit diagram of a VGA 200 according to another embodiment of the disclosure. Comparing to FIG. 2A, in FIG. 2B, the first current-steering circuit 230 and the second current-steering circuit 270 are realized by the analog circuits. In addition, in the embodiment, the structures of the first bias voltage circuit 240 and the second bias voltage circuit 280 are also modified according to the structures of the first current-steering circuit 230 and the second current-steering circuit 270. The first current-steering circuit 230, the first bias voltage circuit 240, the second current-steering circuit 270 and the second bias voltage circuit 280 of FIG. 2B are illustrated below. The same parts of FIG. 2A and FIG. 2B are not repeated below. In addition, it should be noted that FIG. 2B shows the VGA 200 which comprises two stages of amplifier circuits, but the disclosure is not limited thereto. The embodiment of FIG. 2B also could be applied to the VGA which comprises one stage of amplifier circuit or the VGA which comprises more than two stages of amplifier circuits. For example, if the VGA 200 only comprise one stage of amplifier circuit, the VGA 200 may only comprise a first conjugate matching circuit 210 (could be corresponded to the first conjugate matching circuit 110), a first amplifier circuit 220 (could be regarded as the amplifier circuit 120), a first current-steering circuit 230 (could be regarded as the current-steering circuit 130), a first bias voltage circuit 240 (could be regarded as the bias voltage circuit 140) and a second conjugate matching circuit 250 (could be regarded as the second conjugate matching circuit 150).

As shown in FIG. 2B, the first current-steering circuit 230 may comprise the third transistor M3, resistor R5, and capacitors C13~14. The third transistor M3 is a triple-well transistor. The gate of the third transistor M3 is coupled to the resistor R5 and the capacitor C14, and receives the analog control signal $V_c1$ through the resistor R5. According to the analog control signal $V_c1$, the third transistor M3 could draw current from the second transistor M2 to control the gain of the first amplifier circuit 220. The source of the third transistor M3 is coupled to the drain of the first transistor M1 and the source of the second transistor M2. The drain of the third transistor M3 is coupled to the capacitor C13 and the source voltage $V_{DD}$. The body of the third transistor M3 receives positive voltage provided by the first bias voltage circuit 240. One end of the capacitor C13 is coupled to the ground, and the other end of the capacitor C13 is coupled to the drain of the third transistor M3 and the source voltage $V_{DD}$. The capacitor C13 could be used to regulate the drain voltage of the third transistor M3. One end of the capacitor C14 is coupled to the gate of the third transistor M3 and resistor R5, and the other end of the capacitor C14 is coupled to the ground. The capacitor C14 could be used to regulate the gate voltage of the third transistor M3. One end of the resistor R5 is coupled to the gate of the third transistor M3 and the capacitor C14, and the other end of the resistor R5 is coupled to the analog control signal \rd. The resistor R5 could be regarded as a protection device to avoid large currents which may lead to the third transistor M3 breaking.

Details of the operations of the first current-steering circuit 230 of FIG. 2B will be further illustrated below. When the third transistor M3 is enabled according to the analog control signal $V_c1$, the current flowing to the second transistor M2 will be drawn to the third transistor M3, as a result, the current of the second transistor M2 will decrease. When the current of the second transistor M2 decreases, the transduction value (gm2) will decrease, and the whole gain value of the first amplifier circuit 220 will decrease. Therefore, in the embodiment, the analog control signal $V_c1$ could be used to adjust the current flowing to the second transistor M2 to achieve the purpose of controlling the whole gain value of the first amplifier circuit 220. For example, as the analog control signal $V_c1$ becomes higher, the third transistor M3 may draw more current from the second transistor M2 will be drawn more. When the current of the second transistor M2 decreases, the whole gain value of the first amplifier circuit 220 will decrease more, and vice versa.

As shown in FIG. 2B, the first bias voltage circuit 240 may comprise a resistor R6. The resistor R6 is coupled to the body of the third transistor M3 to provide the positive bias voltage $V_{bs}$ to the body of the third transistor M3 through the resistor R6. Because the third transistor M3 is a triple-well transistor, a wire could be connected to its body to receive the voltage (i.e. the positive bias voltage $V_{bs}$ provided by the first bias voltage circuit 240). In addition, referring to the equation, $V_{th}=V_{th0}+\gamma(\sqrt{2\varphi_f-V_{bs}}-\sqrt{2\varphi_f})$, we know that when the positive bias voltage $V_{bs}$ is not 0 and is positive, the threshold voltage $V_{th}$ will become smaller. Therefore, in the embodiment, when the body of the third transistor M3 receives a positive bias voltage $V_{bs}$, the threshold voltage $V_{th}$ of the third transistor M3 will decrease. When the threshold voltage $V_{th}$ of the third transistor M3 decreases, the voltage range which is adjustable according to the analog control signal $V_c1$ will increase. Therefore, the adjustable variable-gain range will increase.

As shown in FIG. 2B, the second current-steering circuit 270 may comprise the seventh transistor M7, resistor R7, and capacitors C15~16. The seventh transistor M7 is a triple-well transistor. The gate of the seventh transistor M7 is coupled to the resistor R7 and the capacitor C16, and receives the analog control signal $V_c2$ through the resistor R7. According to the analog control signal $V_c2$, the seventh transistor M7 could draw current from the fifth transistor M5 to control the gain of the second amplifier circuit 260. The source of the seventh transistor M7 is coupled to the drain of the fourth transistor M4 and the source of the fifth transistor M5. The drain of the seventh transistor M7 is coupled to the capacitor C15 and the source voltage $V_{DD}$. The body of the seventh transistor M7 receives positive voltage provided by the second bias voltage circuit 280. One end of the capacitor C15 is coupled to the ground, and the other end of the capacitor C15 is coupled to the drain of the seventh transistor M7 and the source voltage $V_{DD}$. The capacitor C15 could be used to regulate the drain voltage of the seventh transistor M7. One end of the capacitor C16 is coupled to the gate of the seventh transistor M7 and resistor R7, and the other end of the capacitor C16 is coupled to the ground. The capacitor C16 could be used to regulate the gate voltage of the seventh transistor M7. One end of the resistor R7 is coupled to the gate of the seventh transistor M7 and the capacitor C16, and the other end of the resistor R7 is coupled to the analog control signal $V_c2$. The resistor R7 could be regarded as a protection device to avoid large currents which may lead to the seventh transistor M7 breaking. The operation of the second current-steering circuit 270 of FIG. 2B is similar to the operation of the first current-steering circuit 230 of FIG. 2B. Therefore, details will not be repeated here.

As shown in FIG. 2B, the second bias voltage circuit 280 may comprise a resistor R8. The resistor R8 is coupled to the body of the seventh transistor M7 to provide the positive bias voltage $V_{bs}$ to the body of the seventh transistor M7 through the resistor R8. Because the seventh transistor M7 is a triple-well transistor, a wire could be connected to its body to receive the voltage (i.e. the positive bias voltage $V_{bs}$ provided by the second bias voltage circuit 280). In addition, referring to the equation, $V_{th}=V_{th0}+\gamma(\sqrt{2\varphi_f-V_{bs}}-\sqrt{2\varphi_f})$, we know that when the positive bias voltage $V_{bs}$ is not 0 and is positive, the threshold voltage $V_{th}$ will become smaller. Therefore, in the embodiment, when the body of the seventh transistor M7 receives a positive bias voltage $V_{bs}$, the threshold voltage $V_{th}$ of the seventh transistor M7 will decrease. When the threshold voltage $V_{th}$ of the seventh transistor M7 decreases, the voltage range which is adjustable according to the analog control signal $V_c2$ will increase. Therefore, the adjustable variable-gain range will increase.

When the voltage source $V_{DD}$ provided to the VGA 200 is decreased, the variable-gain range of the VGA 200 will decrease. Specifically, when the voltage source $V_{DD}$ provided to the VGA 200 is decreased, the voltage range which is adjustable according to the analog control signal $V_c1$ and the analog control signal $V_c2$ will decrease, and therefore, the variable-gain range of the VGA 200 will decrease. Therefore, in the embodiment, the first bias voltage circuit 240 and the second bias voltage circuit 280 configured in the VGA 200 could avoid the problem of the decrease of the variable-gain range when the VGA is operated in low voltage (i.e. the source voltage $V_{DD}$ becomes smaller).

Figure 3:
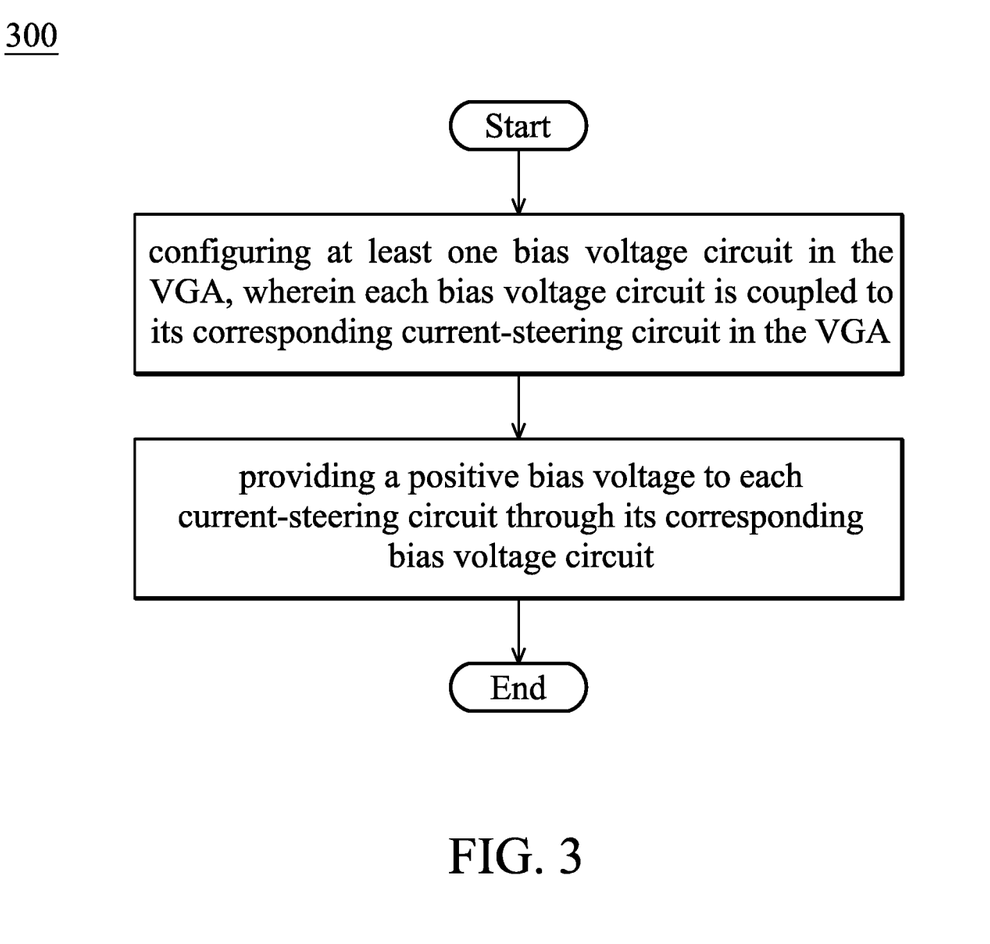
FIG. 3 is a flowchart 300 illustrating a method for increasing the variable-gain range according to an embodiment of the disclosure.

FIG. 3 is a flowchart 300 illustrating a method for increasing the variable-gain range according to an embodiment of the disclosure. The method for increasing the variable gain could be applied to the VGA 100 and VGA 200. As shown in FIG. 3, in step S310, at least one bias voltage circuit is configured in an VGA, wherein each bias voltage circuit may be coupled to its corresponding current-steering circuit of the VGA. In step S320, each bias voltage circuit provides a positive bias voltage to its corresponding current-steering circuit.

In the method for increasing the variable gain of the disclosure, the current-steering circuits may be digital circuits or analog circuits.

In the method for increasing the variable gain of the disclosure, each current-steering circuit may comprise a triple-well transistor, and each bias voltage circuit may be coupled to the body of the triple-well transistor of its corresponding current-steering circuit. When the body of the triple-well transistor receives a positive bias voltage, the threshold voltage of the triple-well transistor will decrease.

In some embodiments, if the current-steering circuit is a digital circuit, when the threshold voltage of the triple-well transistor of the current-steering circuit decreases, the triple-well transistor of the current-steering circuit could draw more current from the amplifier circuit of the VGA. Therefore, the adjustable variable-gain range of the VGA will increase.

In some embodiments, if the current-steering circuit is an analog circuit, when the threshold voltage of the triple-well transistor of the current-steering circuit decreases, the voltage range which is adjustable according to the analog control signal will increase. Therefore, the adjustable variable-gain range of the VGA will increase.

Therefore, in the method for increasing the variable gain of the disclosure, the problem of the decrease of the variable-gain range when the VGA is operated in low voltage (i.e. the source voltage $V_{DD}$ becomes smaller) could be avoided by configuring the bias voltage circuits in the VGA.

Use of ordinal terms such as "first", "second", "third", etc., in the disclosure and claims is for description. It does not by itself connote any order or relationship.

The above paragraphs describe many aspects. Accordingly, the teaching of the disclosure may be accomplished by many methods, and any configurations or functions in the disclosed embodiments only present a representative condition. Those who are skilled in this technology will understand that all of the disclosed aspects in the disclosure may be applied independently or be incorporated.

While the disclosure has been described by way of example and as exemplary embodiments only, it should be understood that the disclosure is not configured to limit thereto. Those who are skilled in this technology could still make various alterations and modifications without departing from the scope and spirit of this disclosure. Therefore, the scope of the invention shall be defined and protected by the following claims and their equivalents.

What is claimed is:

1. A variable gain amplifier (VGA), comprising:
    at least one amplifier circuit;
    at least one current-steering circuit, wherein each current-steering circuit is coupled to its corresponding amplifier circuit; and
    at least one bias voltage circuit, wherein each bias voltage circuit is coupled to its corresponding current-steering circuit to provide a positive bias voltage to each current-steering circuit,
    wherein each of the current-steering circuits comprises a triple-well transistor, and each bias voltage circuit is coupled to a body of the triple-well transistor of its respective current-steering circuit.

2. The VGA of claim 1, wherein each of the current-steering circuits is a digital circuit.

3. The VGA of claim 2, wherein each bias voltage circuit comprises a plurality of conducting wires, and provides the positive bias voltage to the current-steering circuit through the plurality of conducting wires.

4. The VGA of claim 1, wherein each of the current-steering circuits is an analog circuit.

5. The VGA of claim 4, wherein each bias voltage circuit comprises a resistor, and provides the positive bias voltage to the current-steering circuit through the resistor.

6. The VGA of claim 1, wherein when the body of the triple-well transistor receives the positive bias voltage, a threshold voltage of the triple-well transistor decreases.

7. The VGA of claim 1, further comprising:
    at least one conjugate matching circuit, coupled to the at least one amplifier circuit.

8. The VGA of claim 1, wherein each amplifier circuit is a cascode amplifier circuit.

9. A method for increasing variable-gain range, applied to an amplifier (VGA), comprising:
    configuring at least one bias voltage circuit in the VGA, wherein each bias voltage circuit is coupled to its corresponding current-steering circuit in the VGA; and providing a positive bias voltage to each current-steering circuit through its corresponding bias voltage circuit, wherein each of the current-steering circuits comprises a triple-well transistor, and each bias voltage circuit is coupled to a body of the triple-well transistor of its corresponding current-steering circuit.

10. The method for increasing the variable-gain range of claim 9, wherein each of the current-steering circuits is a digital circuit.

11. The method for increasing the variable-gain range of claim 10, wherein each bias voltage circuit comprises a plurality of conducting wires, and each bias voltage circuit provides the positive bias voltage to its corresponding current-steering circuit through the plurality of conducting wires.

12. The method for increasing the variable-gain range of claim 9, wherein each of the current-steering circuits is an analog circuit.

13. The method for increasing the variable-gain range of claim 12, wherein each bias voltage circuit comprises a resistor, and provides the positive bias voltage to the current-steering circuit through the resistor.

14. The method for increasing the variable-gain range of claim 9, wherein when the body of the triple-well transistor receives the positive bias voltage, a threshold voltage of the triple-well transistor decreases.

15. The method for increasing the variable-gain range of claim 9, wherein the VGA further comprises at least one conjugate matching circuit, and the at least one conjugate matching circuit is coupled to the at least one amplifier circuit.

16. The method for increasing the variable-gain range of claim 9, wherein each amplifier circuit is a cascode amplifier circuit.

* * * * *